United States Patent
Yasui

(10) Patent No.: US 10,059,860 B2
(45) Date of Patent: Aug. 28, 2018

(54) POLISHING COMPOSITION

(71) Applicant: FUJIMI INCORPORATED, Kiyosu-shi, Aichi (JP)

(72) Inventor: Akihito Yasui, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 15/120,605

(22) PCT Filed: Jan. 20, 2015

(86) PCT No.: PCT/JP2015/051416
§ 371 (c)(1),
(2) Date: Aug. 22, 2016

(87) PCT Pub. No.: WO2015/129342
PCT Pub. Date: Sep. 3, 2015

(65) Prior Publication Data
US 2017/0009101 A1    Jan. 12, 2017

(30) Foreign Application Priority Data

Feb. 26, 2014    (JP) .................................. 2014-035798

(51) Int. Cl.
| C09G 1/02 | (2006.01) |
| B24B 37/04 | (2012.01) |
| H01L 21/321 | (2006.01) |
| C09K 3/14 | (2006.01) |
| C23F 3/00 | (2006.01) |

(52) U.S. Cl.
CPC .............. *C09G 1/02* (2013.01); *B24B 37/044* (2013.01); *C09K 3/1463* (2013.01); *C23F 3/00* (2013.01); *H01L 21/3212* (2013.01)

(58) Field of Classification Search
CPC ...... C09G 1/02; B24B 37/044; C09K 3/1463; C23F 3/00
See application file for complete search history.

(56) References Cited

U.S. PATENT DOCUMENTS

| 2004/0229552 A1 | 11/2004 | Cherian et al. | |
| 2005/0191823 A1* | 9/2005 | Horikawa | C09G 1/02 438/424 |
| 2006/0175298 A1* | 8/2006 | Zhao | B24B 37/044 216/88 |
| 2008/0242090 A1* | 10/2008 | Yamada | C09G 1/02 438/692 |
| 2009/0103993 A1 | 4/2009 | Spiro et al. | |
| 2010/0311630 A1 | 12/2010 | Mori et al. | |
| 2011/0059680 A1 | 3/2011 | Motonari et al. | |
| 2012/0238094 A1 | 9/2012 | Minami et al. | |
| 2013/0140273 A1 | 6/2013 | Lu et al. | |
| 2013/0186850 A1 | 7/2013 | Wang et al. | |
| 2014/0011362 A1* | 1/2014 | Reichardt | C09G 1/02 438/693 |

FOREIGN PATENT DOCUMENTS

| JP | 2001-085372 A | 3/2001 |
| JP | 2001-139937 A | 5/2001 |
| JP | 2011-003665 A | 1/2011 |
| JP | 2012-015353 A | 1/2012 |
| JP | 2012-182158 A | 9/2012 |
| JP | 2014-229827 A | 12/2014 |
| WO | WO-03/068883 A1 | 8/2003 |
| WO | WO-2007/103578 A1 | 9/2007 |
| WO | WO-2009/104334 A1 | 8/2009 |
| WO | WO-2010/140592 A1 | 12/2010 |
| WO | WO-2013/003991 A1 | 1/2013 |

OTHER PUBLICATIONS

Machine translation of JP 2011-003665A.*

* cited by examiner

*Primary Examiner* — Duy Vu N Deo
(74) *Attorney, Agent, or Firm* — Foley & Lardner LLP

(57) ABSTRACT

The present invention relates to a polishing composition used in application in which a polishing object having a cobalt element-containing layer is polished, including: a cobalt dissolution inhibitor; and a pH adjusting agent, wherein the polishing composition has a pH of 4 or more and 12 or less, and the cobalt dissolution inhibitor is at least one member selected from the group consisting of an organic compound having an ether bond, an organic compound having a hydroxyl group, an organic compound having a carboxyl group and having a molecular weight of 130 or more, and salts thereof. According to the present invention, there is provided a polishing composition capable of suppressing the dissolution of a cobalt element-containing layer when a polishing object having a cobalt element-containing layer is polished.

10 Claims, No Drawings

POLISHING COMPOSITION

TECHNICAL FIELD

The present invention relates to a polishing composition, and particularly to a polishing composition having a high effect of suppressing the dissolution of a cobalt element-containing layer.

BACKGROUND ART

In recent years, new fine processing techniques have been developed along with high integration and high performance of large scale integration (LSI). A chemical mechanical polishing (hereinafter, also simply referred to as "CMP") method is one of the techniques, and is a technique frequently used for planarization of an interlayer insulation film, metal plug formation, and buried wiring (damascene wiring) formation in an LSI production process, in particular, in a multilayer wiring forming process. The damascene wiring technique enables wiring process simplification and improvement in yield and reliability, and thus it is considered that application of the damascene wiring technique will hereafter increase.

The common method of CMP is as follows: a polishing pad is attached onto a circular polishing table (platen), the surface of the polishing pad is immersed with a polishing agent, a surface of a substrate, on which a metal film is formed, is pressed; the polishing platen is rotated while a predetermined pressure (hereinafter, also simply referred to as "polishing pressure") is applied to the substrate from the back side thereof; and the metal film in projecting part is removed by the mechanical friction between the polishing agent and the projecting part of the metal film.

Incidentally, for the damascene wiring, copper is currently mainly used as a wiring metal since copper has low resistivity, and use of copper is considered to increase hereafter also in memory devices represented by a dynamic random access memory (DRAM). Further, in the lower layer of a conductive material (copper, a copper alloy, or the like), which forms damascene wiring, a barrier layer is formed in order to prevent the conductive material from diffusing into the interlayer insulation film. Examples of a material constituting the barrier layer, which is conventionally used, include tantalum, a tantalum alloy, and a tantalum compound (for example, JP 2001-85372 A and JP 2001-139937 A).

In recent years, with wiring miniaturization tendency, it is difficult to perform plating with copper in a favorable state, and a phenomenon that voids are generated (phenomenon that any substance is not present locally) occurs.

In this regard, in order to solve the above problems, recently, there is an attempt to compensate adhesiveness by using a layer containing a cobalt element or a cobalt compound, which is highly compatible with copper, between the barrier layer and copper.

SUMMARY OF INVENTION

In the damascene wiring technique, generally, a barrier layer and a metal wiring layer are formed on an insulating layer provided with a trench and then the excessive wiring material (the metal wiring layer) in the region other than the wiring portion and the barrier layer are removed by CMP.

Recently, as described above, the damascene wiring technique using the cobalt element-containing layer is studied, but a problem arises in that cobalt is easily dissolved when the cobalt element-containing layer was polished by CMP. More specifically, in the damascene wiring technique, when CMP is performed to remove the excessive wiring material layer and the barrier layer, there is a problem in that the cobalt element-containing layer is dissolved and thus pits or corrosion occurs on the surface. As such, if pits or corrosion occurs on the cobalt element-containing layer when CMP is performed, there is a concern that the function of the cobalt element-containing layer may be impaired.

Accordingly, there is a demand for a polishing composition capable of suppressing the dissolution of a cobalt element-containing layer when a polishing object having a cobalt element-containing layer is polished.

Therefore, an object of the present invention is to provide a polishing composition capable of suppressing the dissolution of a cobalt element-containing layer when a polishing object having a cobalt element-containing layer is polished.

The present inventors have conducted intensive researches in order to solve the above problem. As a result, the present inventors have found that the above problem can be solved by using a polishing composition which contains a pH adjusting agent and a cobalt dissolution inhibitor selected from the group consisting of specific organic compounds and has a pH of 4 or more and 12 or less. More specifically, the present invention has been completed on the basis of a finding that the dissolution of cobalt is effectively suppressed by using, as a cobalt dissolution inhibitor, at least one member selected from the group consisting of an organic compound having an ether bond, an organic compound having a hydroxyl group, an organic compound having a carboxyl group and having a molecular weight of 130 or more, and salts thereof.

That is, the present invention is a polishing composition used in application in which a polishing object having a cobalt element-containing layer is polished, the polishing composition including: a cobalt dissolution inhibitor; and a pH adjusting agent, wherein the polishing composition has a pH of 4 or more and 12 or less, and the cobalt dissolution inhibitor is at least one member selected from the group consisting of an organic compound having an ether bond, an organic compound having a hydroxyl group, an organic compound having a carboxyl group and having a molecular weight of 130 or more, and salts thereof.

DESCRIPTION OF EMBODIMENTS

The present invention is a polishing composition used in application in which a polishing object having a cobalt element-containing layer is polished, the polishing composition including: a cobalt dissolution inhibitor; and a pH adjusting agent, wherein the polishing composition has a pH of 4 or more and 12 or less, and the cobalt dissolution inhibitor is at least one member selected from the group consisting of an organic compound having an ether bond, an organic compound having a hydroxyl group, an organic compound having a carboxyl group and having a molecular weight of 130 or more, and salts thereof. With such a configuration, it is possible to effectively suppress the dissolution of the cobalt element-containing layer.

Cobalt constituting a barrier layer or the like is dissolved under the polishing condition for the usual barrier layer (and the metal wiring layer). For this reason, the present inventors have reviewed various compounds as a cobalt dissolution inhibitor. As a result, surprisingly, the present inventors have found that when at least one member selected from the group consisting of an organic compound having an ether bond, an organic compound having a hydroxyl group, an organic compound having a carboxyl group and having a molecular weight of 130 or more, and salts thereof is added to a polishing composition, an excellent effect of suppressing the dissolution of cobalt is achieved. The mechanism thereof is described as follows; however, the following mechanism is a presumption, and thus the present invention is not limited to the mechanism described below in any way.

Under the condition of weak acidity to alkalinity (a region having a pH of about 4 or more and 12 or less), which is the polishing condition for the usual barrier layer (and the metal wiring layer), cobalt constituting a barrier layer or the like is easily oxidized by water or the like to be used in polishing. As a result, it is considered that cobalt of which the surface is oxidized is easily dissolved when CMP is performed.

At this time, it is presumed that the outermost surface of cobalt contained in the layer is covered with a hydroxyl group (—OH), an oxygen atom (O), an oxygen ion ($O^{2-}$), or the like. On the other hand, since the cobalt dissolution inhibitor used in the present invention has at least one of an ether bond, a hydroxyl group, and a carboxyl group, the structure (functional group) thereof is likely to be chemically adsorbed strongly to a hydroxyl group, an oxygen atom, an oxygen ion, or the like on the outermost surface of cobalt by hydrogen bonding. Therefore, when the organic compound having the specific structure (functional group) is chemically adsorbed to the oxidized outermost surface of cobalt, the organic compound can function as a coating film (passive film) covering the surface of the layer. As a result, it is considered that the dissolution and polishing of the layer can be effectively suppressed.

However, the present inventors have also found that there is a case where even an organic compound having a carboxyl group cannot be used as a cobalt dissolution inhibitor, and further conducted investigation. As a result, the present inventors have found that an organic compound having a molecular weight of 130 or more among organic compounds having a carboxyl group effectively functions as a cobalt dissolution inhibitor. Regarding this point, the presumption is made as follows.

An organic compound having a small molecular weight among organic compounds having an acidic group such as a carboxyl group generally tends to have high acidity (a small pKa). Since an organic compound having high acidity dissolves cobalt in CMP, the organic compound may not be able to function as a cobalt dissolution inhibitor. Therefore, when an organic compound having a carboxyl group is used as a cobalt dissolution inhibitor, it is necessary to use a compound having relatively low acidity. Herein, the organic compound having an acidic group such as a carboxyl group generally tends to have lower acidity (a larger pKa) as the molecular weight thereof increases. Therefore, when the molecular weight of the organic compound having a carboxyl group is set to 130 or more, the organic compound dose not dissolve cobalt due to the acidity of the organic compound itself even while the organic compound is adsorbed to the oxidized surface of cobalt. Thus, it is possible to obtain the effect of suppressing the dissolution of cobalt.

Therefore, from the above description, according to the present invention, there is provided a polishing composition capable of suppressing the dissolution of a cobalt element-containing layer when a polishing object having a cobalt element-containing layer is polished.

The polishing composition, the polishing method using the polishing composition, and the method for producing a substrate according to the present invention will be described hereinafter in detail.

[Polishing Object]

First, an example of the polishing object and a semiconductor wiring process according to the present invention will be described. The semiconductor wiring process usually includes the following steps.

First, an insulating layer having a trench is formed on a substrate. Then, a barrier layer, a cobalt element-containing layer, and a metal wiring layer are sequentially formed on the insulating layer. Incidentally, the expression "cobalt element-containing" in the present specification represents an aspect in which a cobalt element is contained in the layer. Cobalt in the layer may be a single element, or may be present in the form of a cobalt oxide, a cobalt compound, or a cobalt alloy.

The barrier layer and the cobalt element-containing layer are formed on the insulating layer so as to cover the surface of the insulating layer before the metal wiring layer is formed. The method of forming these layers is not particularly limited, and for example, these layers can be formed by a known method such as a sputtering method or a plating method. The thickness of each of the barrier layer and the cobalt element-containing layer is smaller than the depth and width of the trench. The metal wiring layer is formed on the barrier layer such that at least the trench is buried, subsequently to formation of the barrier layer and the cobalt element-containing layer. The method of forming the metal wiring layer is not particularly limited, and for example, the metal wiring layer can be formed by a known method such as a sputtering method or a plating method.

Next, the excessive wiring material layer in the region other than the wiring portion, the cobalt element-containing layer, and the barrier layer are removed by CMP. As a result, at least a portion of the barrier layer portion located in the trench (inner side portion of the barrier layer), at least a portion of the cobalt element-containing layer portion located in the trench (inner side portion of the cobalt element-containing layer), and at least a portion of the metal wiring layer portion located in the trench (inner side portion of the metal wiring layer) remain on the insulating layer. That is, a portion of the barrier layer, a portion of the cobalt element-containing layer, and a portion of the metal wiring layer remain in the inner side of the trench. In this way, the portion of the metal wiring layer remaining in the inner side of the trench functions as a wiring. Incidentally, the details of the method of polishing these metal wiring layer, cobalt element-containing layer, and barrier layer by CMP will be described later.

The barrier layer may contain other metals. Examples of the other metals include tantalum, titanium, and tungsten; and a noble metal such as gold, silver, platinum, palladium, rhodium, ruthenium, iridium, or osmium. These other metals may be used singly or in combination of two or more kinds thereof.

A metal contained in the metal wiring layer is not particularly limited; however, examples thereof include copper, aluminum, hafnium, cobalt, nickel, titanium, and tungsten. These metals may be contained in the metal wiring layer in the form of an alloy or a metal compound. The metal contained in the metal wiring layer is preferably copper or a copper alloy. These metals may be used singly or in combination of two or more kinds thereof.

Next, the configuration of the polishing composition of the present invention will be described in detail.

[Cobalt Dissolution Inhibitor]

The polishing composition of the present invention contains a cobalt dissolution inhibitor. As described above, the cobalt dissolution inhibitor is added for the purpose of suppressing the dissolution of cobalt when CMP is performed. In the present invention, the cobalt dissolution inhibitor is at least one member selected from the group consisting of an organic compound having an ether bond, an organic compound having a hydroxyl group, an organic compound having a carboxyl group and having a molecular weight of 130 or more, and salts thereof.

Incidentally, the term "organic compound" in the present specification collectively means all compounds containing a carbon atom and a hydrogen atom, and is not particularly limited. For example, aliphatic compounds and aromatic compounds can be mentioned as examples. In addition, the term "salt" in the present specification means a compound produced through the neutralization of charges by positive ions and negative ions. In the present invention, the salt in the polishing composition may be present in the state in which some or all of the salt is dissociated, and the expression "containing a salt" includes a case where the salt is present in the state in which the salt is dissociated in this way. In addition, the organic compound serving as a cobalt dissolution inhibitor may be an organic compound having two or more structures (functional groups) selected from an ether bond, a hydroxyl group, and a carboxyl group. However, even in a case where an organic compound having one or more carboxyl groups contains an ether bond or a hydroxyl group, the organic compound is classified into a compound having a carboxyl group. Therefore, for example, in the case of a compound having both of a hydroxyl group and a carboxyl group, the compound is classified into an organic compound having a carboxyl group.

The cobalt dissolution inhibitor may be a low-molecular compound or a high-molecular compound as long as it has the specific structure (functional group). Incidentally, the term "low-molecular compound" in the present specification indicates a compound having a molecular weight of less than 400. The molecular weight of the low-molecular compound can be calculated based on the chemical formula. In addition, the term "high-molecular compound" indicates a compound having a molecular weight of 400 or more. The measurement of the molecular weight of the high-molecular compound is generally performed by a gel permeation chromatography (GPC) method or a light scattering method; however, in the present specification, the molecular weight (weight average molecular weight) indicates a value measured by a GPC method using polystyrene as a standard substance and tetrahydrofuran (THF) as a mobile phase.

The cobalt dissolution inhibitor in the present invention is an organic compound having an ether bond, a hydroxyl group, a carboxyl group, or salts thereof as a hydrophilic group and a hydrophobic group having an organic skeleton containing a carbon-carbon bond. As such, it is considered that when the organic compound having a hydrophilic group and a hydrophobic group is adsorbed to a cobalt-containing layer, the hydrophilic group and the hydrophobic group are oriented to the substrate (the cobalt-containing layer) side and the inside of the polishing liquid due to the hydrophobic interaction to be aligned, respectively, so that a molecular film is formed. Therefore, such a molecular film in which the hydrophobic group faces the polishing liquid side is likely to be oriented densely, and as the hydrophobic group becomes large, a denser molecular film is formed. Thus, it is presumed that the molecular film tends to function as a strong corrosion-resistant film in the polishing liquid used in CMP. Therefore, the molecular weight of the organic compound serving as a cobalt dissolution inhibitor is not particularly limited; however, as the molecular weight increases, there is a tendency that a higher effect of suppressing the dissolution of cobalt can be exerted.

The organic compound having an ether bond or a hydroxyl group does not dissolve cobalt as long as it does not contain an acidic group, or even if the organic compound dissolves cobalt, the dissolution of cobalt is a degree of causing no particular problem. The molecular weight is one of factors influencing the acidity of the organic compound; however, the molecular weight of the organic compound having an ether bond or a hydroxyl group is not particularly limited. When an organic compound having an ether bond or a hydroxyl group and not containing an acidic group is used as a cobalt dissolution inhibitor, the lower limit of the molecular weight of the organic compound is not particularly limited; however, from the viewpoint of forming a dense molecular film by the hydrophobic group, the lower limit thereof is preferably 50 or more, more preferably 60 or more, and even more preferably 100 or more. In addition, as described above, since a larger molecular weight is preferable, the upper limit thereof is not particularly limited, but is practically 1000000 or less.

Further, an organic compound having an ether bond or a hydroxyl group and containing an acidic group (provided that, excluding a carboxyl group) may dissolve cobalt. For this reason, in order to decrease acidity and suppress the dissolution of cobalt, a larger molecular weight thereof is preferable. Specifically, although depending on the type of the acidic group contained in the compound, the lower limit of the molecular weight of the organic compound is preferably 100 or more, more preferably 130 or more, and even more preferably 150 or more. In addition, the upper limit thereof is not particularly limited, but is practically 1000000 or less.

Incidentally, unless otherwise specified, the term "acidic group" in the present specification indicates a substituent having a dissociable proton and has a pKa of 11 or less. Examples thereof include an acid group that is a group exhibiting acidity such as a phosphonyl group, a phosphoryl group, a sulfo group, or a boric acid group.

When the organic compound having a carboxyl group is used as a cobalt dissolution inhibitor, as described above, the lower limit of the molecular weight thereof is 130 or more. From the viewpoint of forming a molecular film having a high density by a hydrophobic group, a larger molecular weight thereof is preferable. The lower limit of the molecular weight is preferably 140 or more, more preferably 150 or more, even more preferably 180 or more, and particularly preferably 200 or more. Meanwhile, the upper limit of the molecular weight is not particularly limited, but is practically 1000000 or less.

Incidentally, when the organic compound is in the form of a salt, the molecular weight described above indicates the molecular weight of the organic compound before the specific structure (functional group) forms a salt.

Specific examples of an organic compound preferably used as a cobalt dissolution inhibitor in the polishing composition according to the present invention will be described below.

The organic compound having an ether bond is not particularly limited; however, examples thereof include an aliphatic ether such as diethyl ether, dipropyl ether, tert-butyl methyl ether, tert-amyl ethyl ether, dimethoxyethane, diethoxyethane, diglyme, triglyme, furan, tetrahydrofuran, tetrahydromethylfuran, or dioxolane; an aromatic ether such as methoxybenzene or ethoxybenzene; a lactone such as γ-butyrolactone, γ-valerolactone, γ-hexalactone, γ-heptalactone, γ-octalactone, γ-nonalactone, δ-hexalactone, δ-octalactone, or δ-nonalactone; and a high-molecular compound such as cellulose, pullulan, glucomannan, agarose, gelatin, polyoxyethylene (20) sorbitan monooleate, polyoxyethylene (20) sorbitan monostearate, polyoxyethylene (20) sorbitan monolaurate, or polyoxyethylene (20) sorbitan tristearate. Among them, the organic compound having an ether bond preferably has a polyoxyethylene structure and/or a polyoxypropylene structure. The organic compound having such a structure is preferable since the organic compound easily forms a dense molecular film by an oxygen atom and an ethylene chain or a propylene chain, and has a high effect of suppressing the dissolution of cobalt. Therefore, among the organic compounds described above, polyoxyethylene (20) sorbitan monooleate, polyoxyethylene (20) sorbitan monostearate, polyoxyethylene (20) sorbitan monolaurate, or the like is preferable. In addition, from the viewpoint of having high water solubility and handleability in polishing, furan, tetrahydrofuran, γ-nonalactone, pullulan, or the like is preferable.

Further, the organic compound having a hydroxyl group also preferably has a structure having an ether bond in addition to a hydroxyl group. That is, the cobalt dissolution inhibitor is preferably an organic compound having an ether bond and a hydroxyl group. The organic compound with a structure having an ether bond and a hydroxyl group can form a dense molecular film, and thus such organic compound has the high suppressing effect of the dissolution of cobalt. Examples of such an organic compound include cellulose, pullulan, glucomannan, agarose, gelatin, polyoxyethylene (20) sorbitan monooleate, polyoxyethylene (20) sorbitan monostearate, polyoxyethylene (20) sorbitan monolaurate, and polyoxyethylene (20) sorbitan tristearate.

The organic compound having a hydroxyl group is not particularly limited; however, examples thereof include aliphatic alcohols such as methanol, ethanol, n-propanol, iso-propanol, n-butanol, tert-butanol, n-pentanol, n-hexanol, n-hexanol, n-octanol, n-nonyl alcohol, n-dodecyl alcohol, n-stearyl alcohol, methoxyethanol, ethoxyethanol, butoxyethanol, and (2-ethoxy)-ethoxyethanol; aromatic alcohols such as phenol, α-naphthol, and β-naphthol; and alcohol-based polymers such as polyvinyl alcohol. Among them, the organic compound having a hydroxyl group preferably has an alcohol skeleton or a phenol skeleton. The compound having such a structure is preferable since the compound has a high effect of suppressing the dissolution of cobalt. Therefore, among the above organic compounds, n-propanol, iso-propanol, n-butanol, phenol, polyvinyl alcohol, and the like are preferable. These organic compounds are also preferable from the viewpoint of having high water solubility and handleability in polishing.

Examples of the organic compound having a carboxyl group and having a molecular weight of 130 or more include a saturated or unsaturated fatty acid ($R^1COOH$; $R^1$ is an alkyl group, alkenyl group, alkynyl group, cycloalkyl group, cycloalkenyl group, or cycloalkynyl group having 7 to 20 carbon atoms, respectively) such as caprylic acid, capric acid, lauric acid, myristic acid, palmitic acid, stearic acid, behenic acid, oleic acid, elaidic acid, linoleic acid, linolenic acid, stearolic acid, or rosin acid (abietic acid, palustric acid, isopimaric acid, or the like); an aromatic carboxylic acid having 7 to 20 carbon atoms such as phenylacetic acid, cinnamic acid, methylcinnamic acid, or naphthoic acid; a saturated or unsaturated divalent fatty acid ($HOOC-R^2-COOH$; $R^2$ is an alkylene group, alkenylene group, alkynylene group, cycloalkylene group, cycloalkenylene group, or cycloalkynylene group having 7 to 20 carbon atoms, respectively) such as adipic acid, pimelic acid, suberic acid, or azelaic acid; and a divalent aromatic carboxylic acid having 8 to 21 carbon atoms such as phthalic acid, isophthalic acid, or terephthalic acid. Among them, from the viewpoint of having high water solubility and handleability in polishing, lauric acid, oleic acid, rosin acid (particularly, abietic acid), and the like are preferable.

In the polishing composition of the present invention, a salt which can be used as a cobalt dissolution inhibitor is a compound in which the specific structure (functional group) contained in the organic compound, that is, an ether bond, a hydroxyl group, or a carboxyl group constitutes a salt. That is, a combination of negative ions derived from the compound having the above-mentioned specific structure (functional group) and positive ions (counter ions) which form a pair with the negative ions is exemplified. Thus, preferred examples of such a salt include a monovalent metal salt such as a lithium salt, a sodium salt, or a potassium salt; an ammonium salt; and an amine salt such as an alcohol amine salt or an alkyl amine salt. Among these salts, potassium lauryl acid, ammonium lauryl acid, and a lauryl acid triethanolamine salt are even more preferable.

The organic compound or a salt thereof can be used singly or as a mixture of two or more kinds thereof.

From the above description, the compound used as a cobalt dissolution inhibitor in the polishing composition of the present invention is preferably at least one member selected from the group consisting of furan, tetrahydrofuran, γ-nonalactone, pullulan, n-propanol, iso-propanol, n-butanol, phenol, polyvinyl alcohol, lauric acid, oleic acid, abietic acid, potassium lauryl acid, ammonium lauryl acid, a lauryl acid triethanolamine salt, and polyoxyethylene (20) sorbitan monooleate. Among these, the cobalt dissolution inhibitor is preferably at least one member selected from the group consisting of lauric acid, oleic acid, potassium lauryl acid, and ammonium lauryl acid.

Incidentally, in the specific examples described above, compounds overlapping the compound group mentioned as other components to be described below are described; however, in a case where such a compound is included in the polishing composition, the compound is considered to be contained as a cobalt dissolution inhibitor.

Among the above compounds, the cobalt dissolution inhibitor is preferably an organic compound having a carboxyl group and having a molecular weight of 130 or more or a salt thereof from the reason that the organic compound tends to be more easily adsorbed to the oxidized surface of cobalt.

Moreover, the organic compound having a carboxyl group and having a molecular weight of 130 or more preferably has, as described above, a structure having an organic skeleton that becomes a hydrophobic group in addition to a carboxyl group as a hydrophilic group, from the viewpoint that, in the molecular structure, the hydrophobic group is oriented in the polishing solution to easily form a molecular film (to easily form a strong molecular film by self-arrangement). In addition, since the carboxyl group is easily adsorbed particularly to the surface of cobalt as compared with an oxygen atom of the ether bond or the hydroxyl group, the organic compound having a carboxyl group enables a stronger molecular film to be formed. At this time, since the organic compound, which is adsorbed to the surface of cobalt by the carboxyl group, forms an insoluble salt such as cobalt carboxylate (for example, cobalt laurate), a favorable passive film is formed on the surface of cobalt and thus the dissolution (corrosion) of cobalt can be effectively prevented.

The content (concentration) of the cobalt dissolution inhibitor in the polishing composition of the present invention is not particularly limited as long as the cobalt dissolution inhibitor can sufficiently cover the oxidized surface of cobalt in the layer, and even when an extremely small amount of the cobalt dissolution inhibitor is used, the effect thereof can be exerted. When the cobalt dissolution inhibitor is a low-molecular compound (specifically, a compound having a molecular weight of less than 400), the lower limit of the content (concentration) of the cobalt dissolution inhibitor is preferably 0.0001 g/L or more, more preferably 0.0005 g/L or more, and even more preferably 0.001 g/L or more. When the content is set to 0.0001 g/L or more, the cobalt dissolution inhibitor sufficiently covers the layer surface and the effect of suppressing the dissolution of cobalt can be sufficiently exerted. In addition, when a larger amount of the cobalt dissolution inhibitor is contained in the polishing composition of the present invention, the effect of suppressing the dissolution of cobalt becomes higher, and the upper limit of the content (concentration) thereof is not particularly limited. However, a cobalt dissolution inhibitor having a higher effect of suppressing the dissolution of cobalt also tends to have a lower polishing rate of cobalt. Therefore, from an economic perspective and from the viewpoint that the polishing rate of cobalt should not be lowered than necessary, the upper limit of the content of the cobalt dissolution inhibitor is preferably 10 g/L or less, more preferably 5 g/L or less, and even more preferably 0.5 g/L or less. In such a range, the effect of the present invention can be more effectively obtained. Incidentally, when two or more kinds of the cobalt dissolution inhibitor are used, the total amount of the cobalt dissolution inhibitors is preferably in the above range.

Further, when the cobalt dissolution inhibitor is a high-molecular compound (specifically, a compound having a molecular weight of 400 or more), the lower limit of the content (concentration) of the cobalt dissolution inhibitor is not also particularly limited, and even when an extremely small amount of the cobalt dissolution inhibitor is used, the effect thereof can be exerted; however, the lower limit thereof is preferably 0.001 g/L or more, more preferably 0.005 g/L or more, and even more preferably 0.01 g/L or more. When the content is set to 0.001 g/L or more, the cobalt dissolution inhibitor sufficiently covers the layer surface and the effect of suppressing the dissolution of cobalt can be sufficiently exerted. In addition, when a larger amount of the cobalt dissolution inhibitor is contained in the polishing composition of the present invention, the effect of suppressing the dissolution of cobalt becomes higher, and the upper limit of the content (concentration) thereof is not particularly limited. However, similarly to the above description, from an economic perspective and from the viewpoint that the polishing rate of cobalt should not be lowered than necessary, when the cobalt dissolution inhibitor is a high-molecular compound, the upper limit thereof is preferably 10 g/L or less, more preferably 5 g/L or less, and even more preferably 0.5 g/L or less. In such a range, the effect of the present invention can be more effectively obtained. Incidentally, when two or more kinds of the cobalt dissolution inhibitor are used, the total amount of the cobalt dissolution inhibitors is preferably in the above range.

Furthermore, when a low-molecular compound and a high-molecular compound are used together as a cobalt dissolution inhibitor, the content (concentration) of the cobalt dissolution inhibitor is preferably set to the preferred content (concentration) in the case of using the high-molecular compound.

The cobalt dissolution inhibitor contained in the polishing composition according to the present invention preferably has the following properties. Specifically, the cobalt dissolution inhibitor is preferably a compound having an electrical quantity of less than 35 $mC/cm^2/min$ in the evaluation of the corrosion amount of the cobalt dissolution inhibitor. The electrical quantity is proportional to the dissolution amount of cobalt, and a small value of the electrical quantity means that the dissolution of cobalt is suppressed.

Therefore, the electrical quantity obtained by measurement preferably has a small value from the viewpoint of suppressing the dissolution of cobalt, and the upper limit thereof is more preferably 30 $mC/cm^2/min$ or less, even more preferably 25 $mC/cm^2/min$ or less, and particularly preferably 15 $mC/cm^2/min$ or less. Meanwhile, decrease of the electrical quantity means, the dissolution of cobalt is further suppressed; on the other hand, the polishing rate of the cobalt-containing layer decreases. Therefore, the electrical quantity is preferably 0.01 $mC/cm^2/min$ or more. In such a range, it is possible to suppress the dissolution of cobalt and to obtain a sufficient polishing rate of cobalt. Incidentally, the value of the above-mentioned electrical quantity indicates a value measured by the method described in Examples.

[pH Adjusting Agent]

The pH of the polishing composition of the present invention is 4 or more and 12 or less. When the pH is less than 4, there is a problem that the dissolution of cobalt is not sufficiently suppressed. On the other hand, when the pH is more than 12, there is a problem that the abrasive grains added as the polishing agent would be dissolved. Incidentally, the term "pH" in the present specification indicates a value measured at a liquid temperature (25° C.) by using a pH meter (Model No. F-72 manufactured by HORIBA, Ltd.).

In order to more easily obtain the effect of the cobalt dissolution inhibitor, the lower limit of the pH is preferably 4.0 or more, more preferably 4.5 or more, and even more preferably 5.0 or more. In addition, in order to sufficiently exert the effect of the cobalt dissolution inhibitor, the upper limit of the pH is preferably 12.0 or less, more preferably 11.0 or less, and even more preferably 10.5 or less.

The pH can be adjusted by adding an appropriate amount of the pH adjusting agent. With the addition of the pH adjusting agent, the pH of the polishing composition is adjusted, and thus it is possible to control the polishing rate of the polishing object, the dispersibility of the abrasive grains, and the like. The pH adjusting agent may be used singly or as a mixture of two or more kinds thereof. In addition, the pH adjusting agent may be any of an acid and a base, and may be any of an inorganic compound and an organic compound.

Specific examples of the acid include inorganic acids such as sulfuric acid, nitric acid, boric acid, carbonic acid, hypophosphorous acid, phosphorous acid, and phosphoric acid; and organic acids such as a carboxylic acid (provided that, a carboxylic acid having a molecular weight of less than 130) including formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-benzoic acid, glycolic acid, glyceric acid, oxalic acid, malonic acid, succinic acid, and lactic acid and an organic sulfuric acid including methanesulfonic acid, ethanesulfonic acid, and isethionic acid.

Specific examples of the base include an amine such as ammonia, ethylenediamine, and piperazine, a quaternary ammonium salt such as tetramethylammonium and tetraethylammonium, a hydroxide of alkali metal such as potassium hydroxide, and a hydroxide of alkaline-earth metal. These pH adjusting agents can be used singly or as a mixture of two or more kinds thereof.

Among these, from the viewpoint of ease of availability, the pH adjusting agent is preferably at least one member selected from the group consisting of acetic acid, sulfuric acid, nitric acid, tetramethylammonium, and potassium hydroxide.

Incidentally, in the specific examples described above, compounds overlapping the compound group mentioned as other components to be described below are described; however, in a case where such a compound is included in the polishing composition, the compound is considered to be contained as a pH adjusting agent.

The content of the pH adjusting agent is not particularly limited, and may be such an amount that realizes a desired pH. Incidentally, even if a small amount of the cobalt dissolution inhibitor of the present invention is used, the effect of the cobalt dissolution inhibitor is sufficiently exerted. Thus, even when an organic acid (acetic acid or the like) that generally promotes the dissolution of cobalt is used as a pH adjusting agent, the effect of suppressing the dissolution of cobalt can be sufficiently exerted.

[Other Components]

The polishing composition of the present invention may further contain other components such as water, an abrasive grain, a preservative, an antifungal agent, an oxidant, a reductant, a polishing accelerating agent, a metal corrosion inhibitor, a water-soluble polymer, a surfactant, and an organic solvent for dissolving a sparingly soluble organic substance, as necessary. Hereinafter, water, an abrasive grain, an oxidant, a polishing accelerating agent, and a metal corrosion inhibitor that are preferred other components will be described.

[Water]

The polishing composition of the present invention preferably contains water as a dispersion medium or solvent for dispersing or dissolving each component described above. Water containing impurities as little as possible is preferable from the viewpoint of suppressing inhibition of an action of other components, and specifically, pure water or ultrapure water obtained by removing impurity ions using an ion exchange resin and the foreign matters through filtration, or distilled water is preferable.

[Abrasive Grains]

The polishing composition according to the present invention can contain abrasive grains. The abrasive grains contained in the polishing composition have an action of mechanically polishing a polishing object and improve the polishing rate of the polishing object by the polishing composition.

The abrasive grains to be used may be any of inorganic particles, organic particles, and organic-inorganic composite particles. Specific examples of the inorganic particles include particles composed of a metal oxide such as silica, alumina, ceria, or titania, silicon nitride particles, silicon carbide particles, and boron nitride particles. Specific examples of the organic particles include polymethyl methacrylate (PMMA) particles. The abrasive grains may be used singly or as a mixture of two or more kinds thereof. Moreover, the abrasive grains used may be a commercially available product or a synthetic product.

Among these abrasive grains, silica is preferable and colloidal silica is particularly preferable.

The abrasive grains may be surface-modified. The value of zeta potential of usual colloidal silica is close to zero under an acidic condition and thus silica particles tend to aggregate since electrical repulsion from one another does not occur under an acidic condition. In contrast, the abrasive grains which are surface-modified so as to have a relatively large negative zeta potential value even under an acidic condition strongly repel one another even under an acidic condition to be favorably dispersed, and as a result, the storage stability of the polishing composition is improved. Such surface-modified abrasive grains can be obtained, for example, by mixing a metal such as aluminum, titanium, or zirconium or an oxide thereof with the abrasive grains and doping on the surface of the abrasive grains.

Among them, colloidal silica having an organic acid immobilized is particularly preferable. The immobilization of an organic acid on the surface of colloidal silica to be contained in the polishing composition is performed, for example, by chemically bonding the functional group of the organic acid on the surface of colloidal silica. The immobilization of an organic acid to colloidal silica cannot be accomplished by only allowing colloidal silica to simply coexist with an organic acid. It is possible to perform the immobilization, for example, by the method described in "Sulfonic acid-functionalized silica through quantitative oxidation of thiol groups," Chem. Commun. 246-247 (2003) when sulfonic acid of a kind of organic acids is immobilized on colloidal silica. Specifically, it is possible to obtain colloidal silica having sulfonic acid immobilized on the surface by coupling a silane coupling agent having a thiol group such as 3-mercaptopropyltrimethoxysilane to colloidal silica and then oxidizing the thiol group with hydrogen peroxide. Alternatively, it is possible to perform the immobilization, for example, by the method described in "Novel Silane Coupling Agents Containing a Photolabile 2-Nitrobenzyl Ester for Introduction of a Carboxy Group on the Surface of Silica Gel," Chemistry Letters, 3, 228-229 (2000) when carboxylic acid is immobilized on colloidal silica. Specifically, it is possible to obtain colloidal silica having carboxylic acid immobilized on the surface by coupling a silane coupling agent containing a photoreactive 2-nitrobenzyl ester to colloidal silica and then irradiating with light. In addition, cationic silica produced by adding a basic aluminum salt or a basic zirconium salt as disclosed in JP 4-214022 A can also be used as abrasive grains.

The lower limit of the average primary particle diameter of the abrasive grains is preferably 5 nm or more, more preferably 7 nm or more, and even more preferably 10 nm or more. In addition, the upper limit of the average primary particle diameter of the abrasive grains is preferably 500 nm or less, more preferably 300 nm or less, and even more preferably 150 nm or less. In such a range, the polishing rate of the polishing object by the polishing composition is improved and also it is possible to further suppress the occurrence of the polishing scratch on the surface of the polishing object after being polished using the polishing composition. Incidentally, the average primary particle diameter of the abrasive grains is calculated, for example, based on the specific surface area of the abrasive grains measured by the BET method.

The lower limit of the content of the abrasive grains in the polishing composition is preferably 0.001 g/L or more, more preferably 0.01 g/L or more, even more preferably 0.05 g/L or more, and most preferably 0.1 g/L or more relative to the total amount of the composition. In addition, the upper limit of the content of the abrasive grains in the polishing composition is preferably 500 g/L or less, more preferably 300 g/L or less, and even more preferably 100 g/L or less. In such a range, the polishing rate of the polishing object is improved. Moreover, it is possible to suppress the cost of the polishing composition and to further suppress the occurrence of dishing on the surface of the polishing object after being polished using the polishing composition.

[Oxidant]

The polishing composition according to the present invention can contain an oxidant. The oxidant has an action of oxidizing the surface of the polishing object and has an advantage for improving the polishing rate by the polishing composition when the oxidant is added into the polishing composition.

The usable oxidant is, for example, a peroxide. Specific examples of the peroxide include hydrogen peroxide; peracetic acid; percarbonate; urea peroxide; oxoacid salts of a halogen element such as perchlorate, chlorate, chlorite, and hypochlorite; and persulfate salts such as sodium persulfate, potassium persulfate, and ammonium persulfate. Among them, a persulfate salt and hydrogen peroxide are preferable from the viewpoint of the polishing rate, and hydrogen peroxide is particularly preferable from the viewpoint of the stability in the aqueous solution and environmental load.

The content of the oxidant in the polishing composition is preferably 0.1 g/L or more, more preferably 1 g/L or more, and even more preferably 3 g/L or more. There is an advantage that the polishing rate by the polishing composition is improved as the content of the oxidant increases.

In addition, the content of the oxidant in the polishing composition is preferably 200 g/L or less, more preferably 100 g/L or less, and even more preferably 40 g/L or less. There is an advantage that it is possible to diminish the burden to treat the polishing composition after using for polishing, that is, the effluent in addition to that the material cost of the polishing composition can be cut down as the content of the oxidant decreases. Further, there is also an advantage that the excessive oxidation of the surface of the polishing object by the oxidant is less likely to occur.

[Polishing Accelerating Agent]

The polishing composition according to the present invention can contain a polishing accelerating agent. The polishing accelerating agent is complexed with and bound to the surface of a metal substrate to form an insoluble brittle film on the surface of the metal substrate and thus acts to improve the polishing rate of the metal substrate by the polishing composition. In addition, there is an advantageous effect that the etching action of the polishing accelerating agent enables the polishing rate of the metal substrate by the polishing composition to be improved. Such a polishing accelerating agent is added mainly for polishing a polishing object containing cobalt.

Examples of the usable polishing accelerating agent include an inorganic acid or a salt thereof, an organic acid or a salt thereof, a nitrile compound, an amino acid, ammonia, an amine-based compound or a salt thereof, and a chelating agent. These polishing accelerating agents may be used singly or as a mixture of two or more kinds thereof. In addition, the polishing accelerating agent used may be a commercially available product or a synthetic product.

Specific examples of the inorganic acid include hydrochloric acid, sulfuric acid, nitric acid, carbonic acid, boric acid, tetrafluoroboric acid, hypophosphorous acid, phosphorous acid, phosphoric acid, and pyrophosphoric acid.

Specific examples of the organic acid include a carboxylic acid such as a monocarboxylic acid including n-heptanoic acid, 2-methylhexanoic acid, n-octanoic acid, 2-ethylhexanoic acid, salicylic acid, and the like; and a polycarboxylic acid including glutaric acid, gluconic acid, adipic acid, pimelic acid, phthalic acid, malic acid, tartaric acid, citric acid, and the like. In addition, it is also possible to use a sulfonic acid such as methanesulfonic acid, ethanesulfonic acid, or isethionic acid.

Incidentally, since a mono- or polycarboxylic acid among the organic acids exemplified above has a molecular weight of 130 or more, the mono- or polycarboxylic acid can be used as an agent serving as both the cobalt dissolution inhibitor and the polishing accelerating agent.

As the polishing accelerating agent, a salt of the inorganic acids or organic acids may be used. It is possible to expect the pH buffering action particularly in the case of using a salt formed of a weak acid and a strong base, a salt formed of a strong acid and a weak base, or a salt formed of a weak acid and a weak base. Examples of such a salt include potassium chloride, sodium sulfate, potassium nitrate, potassium carbonate, potassium tetrafluoroborate, potassium pyrophosphate, potassium oxalate, trisodium citrate, (+)-potassium tartrate, and potassium hexafluorophosphate.

Specific examples of the nitrile compound include acetonitrile, aminoacetonitrile, propionitrile, butyronitrile, isobutyronitrile, benzonitrile, glutarodinitrile, and methoxyacetonitrile.

Specific examples of the amino acid include leucine, norleucine, isoleucine, phenylalanine, ornithine, lysine, taurine, serine, threonine, tyrosine, bicine, tricine, 3,5-diiodotyrosine, β-(3,4-dihydroxyphenyl)-alanine, thyroxine, 4-hydroxy-proline, methionine, ethionine, lanthionine, cystathionine, cystine, cysteic acid, aspartic acid, glutamic acid, S-(carboxymethyl)-cysteine, asparagine, glutamine, azaserine, arginine, canavanine, citrulline, δ-hydroxy-lysine, creatine, histidine, 1-methyl-histidine, 3-methyl-histidine, and tryptophan.

Specific examples of the amine-based compound include ammonium hydroxide, ammonium carbonate, ammonium hydrogen carbonate, methylamine, dimethylamine, trimethylamine, ethylamine, diethylamine, triethylamine, ethylenediamine, hexamethylenediamine, piperazine hexahydrate, anhydrous piperazine, 1-(2-aminoethyl)piperazine, N-methylpiperazine, diethylenetriamine, and tetramethyl ammonium hydroxide.

Specific examples of the chelating agent include nitrilotriacetic acid, diethylenetriaminepentaacetic acid, ethylenediaminetetraacetic acid, N,N,N-trimethylenephosphonic acid, ethylenediamine-N,N,N',N'-tetramethylenesulfonic acid, trans-cyclohexanediaminetetraacetic acid, 1,2-diaminopropanetetraacetic acid, glycol ether diamine tetraacetic acid, ethylenediamineortho-hydroxyphenylacetic acid, ethylenediaminesuccinic acid (SS form), N-(2-carboxylate ethyl)-L-aspartic acid, β-alanine diacetic acid, 2-phosphonobutane-1,2,4-tricarboxylic acid, 1-hydroxyethylidene-1,1-diphosphonic acid, N,N'-bis(2-hydroxybenzyl)ethylenediamine-N,N'-diacetic acid, and 1,2-dihydroxybenzene-4,6-disulfonic acid.

Among these, from the viewpoint of improving the polishing rate, at least one member selected from the group consisting of an inorganic acid or a salt thereof, a carboxylic acid or a salt thereof, a sulfonic acid or a salt thereof, an amino acid or a salt thereof, ammonia or a salt thereof, an amine-based compound or a salt thereof, and a nitrile compound is preferable.

The lower limit of the content (concentration) of the polishing accelerating agent in the polishing composition is not particularly limited since the effect of the polishing accelerating agent is exerted even in a small amount; however, the lower limit thereof is preferably 0.001 g/L or more, more preferably 0.01 g/L or more, and even more preferably 1 g/L or more. As the content of the polishing accelerating agent increases, the polishing rate of the metal substrate by the polishing composition is improved. Meanwhile, the upper limit of the content (concentration) of the polishing accelerating agent in the polishing composition of the present invention is preferably 100 g/L or less, more preferably 50 g/L or less, and even more preferably 30 g/L or less. In such a range, the effect of the present invention can be efficiently achieved.

Incidentally, an organic compound containing a carboxyl group and having a molecular weight of less than 130 may be added as a polishing accelerating agent as long as the amount thereof is as small as not to impede the effect of the present invention. Examples of such a polishing accelerating agent include monocarboxylic acid such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, lactic acid, glycolic acid, glyceric acid, or benzoic acid; polycarboxylic acid such as oxalic acid, malonic acid, succinic acid, maleic acid, or fumaric acid; and an amino acid such as glycine, α-alanine, β-alanine, N-methyl glycine, N,N-dimethyl glycine, 2-aminobutyric acid, norvaline, valine, proline, sarcosine, homoserine, cysteine, or 4-aminobutyric acid.

When an organic compound containing a carboxyl group and having a molecular weight of less than 130 is used as a polishing accelerating agent, if the content thereof is too large, there would be a concern that the organic compound dissolves cobalt. However, even when the cobalt dissolution inhibitor of the present invention is used in a small amount, the effect thereof can be sufficiently exerted. Therefore, even when such an organic compound is used as a polishing accelerating agent, the upper limit of the content of the polishing accelerating agent is not particularly limited. Thus, when such a compound is used as a polishing accelerating agent, the upper limit of the content thereof is not particularly limited, but is preferably 100 g/L or less. Meanwhile, in order to sufficiently obtain the polishing facilitatory effect, the lower limit of the content thereof is preferably set to 0.01 g/L or more.

[Metal Corrosion Inhibitor]

The polishing composition according to the present invention can contain a metal corrosion inhibitor. With the addition of the metal corrosion inhibitor into the polishing composition, the occurrence of a depression at the side of the wiring due to the polishing using the polishing composition can be further suppressed. Further, the occurrence of dishing on the surface of the polishing object after being polished using the polishing composition can be further suppressed.

The usable metal corrosion inhibitor is not particularly limited; however, a heterocyclic compound or a surfactant is preferable. The number of members in the heterocyclic ring in the heterocyclic compound is not particularly limited. In addition, the heterocyclic compound may be a monocyclic compound or may be a polycyclic compound having a condensed ring. The metal corrosion inhibitor may be used singly or as a mixture of two or more kinds thereof. Further, the metal corrosion inhibitor used may be a commercially available product or a synthetic product.

Specific examples of the heterocyclic compound usable as the metal corrosion inhibitor include a nitrogen-containing heterocyclic compound such as a pyrrole compound, a pyrazole compound, an imidazole compound, a triazole compound, a tetrazole compound, a pyridine compound, a pyrazine compound, a pyridazine compound, a pyrindine compound, an indolizine compound, an indole compound, an isoindole compound, an indazole compound, a purine compound, a quinolizine compound, a quinoline compound, an isoquinoline compound, a naphthyridine compound, a phthalazine compound, a quinoxaline compound, a quinazoline compound, a cinnoline compound, a pteridine compound, a thiazole compound, an isothiazole compound, an oxazole compound, an isoxazole compound, or a furazan compound.

As the further specific examples, examples of the pyrazole compound include 1H-pyrazole, 4-nitro-3-pyrazolecarboxylic acid, 3,5-pyrazolecarboxylic acid, 3-amino-5-phenylpyrazole, 5-amino-3-phenylpyrazole, 3,4,5-tribromopyrazole, 3-aminopyrazole, 3,5-dimethylpyrazole, 3,5-dimethyl-1-hydroxymethylpyrazole, 3-methylpyrazole, 1-methylpyrazole, 3-amino-5-methylpyrazole, 4-aminopyrazolo[3,4-d]pyrimidine, 1,2-dimethylpyrazole, 4-chloro-1H-pyrazolo[3,4-D]pyrimidine, 3,4-dihydroxy-6-methylpyrazolo (3,4-B)-pyridine, and 6-methyl-1H-pyrazolo[3,4-b]pyridine-3-amine.

Examples of the imidazole compound include imidazole, 1-methylimidazole, 2-methylimidazole, 4-methylimidazole, 2-ethyl-4-methylimidazole, 2-isopropylimidazole, benzimidazole, 5,6-dimethylbenzimidazole, 2-aminobenzimidazole, 2-chlorobenzimidazole, 2-methylbenzimidazole, 2-(1-hydroxyethyl)benzimidazole, 2-hydroxybenzimidazole, 2-phenylbenzimidazole, 2,5-dimethylbenzimidazole, 5-methylbenzimidazole, and 5-nitrobenzimidazole.

Examples of the triazole compound include 1,2,3-triazole, 1,2,4-triazole, 1-methyl-1,2,4-triazole, methyl-1H-1,2,4-triazole-3-carboxylate, 1,2,4-triazole-3-carboxylic acid, 1,2,4-triazole-3-methyl carboxylate, 1H-1,2,4-triazole-3-thiol, 3,5-diamino-1H-1,2,4-triazole, 3-amino-1,2,4-triazole-5-thiol, 3-amino-1H-1,2,4-triazole, 3-amino-5-benzyl-4H-1,2,4-triazole, 3-amino-5-methyl-4H-1,2,4-triazole, 3-nitro-1,2,4-triazole, 3-bromo-5-nitro-1,2,4-triazole, 4-(1,2,4-triazole-1-yl)phenol, 4-amino-1,2,4-triazole, 4-amino-3,5-dipropyl-4H-1,2,4-triazole, 4-amino-3,5-dimethyl-4H-1,2,4-triazole, 4-amino-3,5-diheptyl-4H-1,2,4-triazole, 5-methyl-1,2,4-triazole-3,4-diamine, 1H-benzotriazole, 1-hydroxybenzotriazole, 1-aminobenzotriazole, 1-carboxybenzotriazole, 5-chloro-1H-benzotriazole, 5-nitro-1H-benzotriazole, 5-carboxy-1H-benzotriazole, 5-methyl-1H-benzotriazole, 5,6-dimethyl-1H-benzotriazole, 1-(1',2'-dicarboxyethyl)benzotriazole, 1-[N,N-bis(hydroxyethyl)aminomethyl]benzotriazole, 1-[N,N-bis(hydroxyethyl)aminomethyl]-5-methylbenzotriazole, and 1-[N,N-bis(hydroxyethyl)aminomethyl]-4-methylbenzotriazole.

Examples of the tetrazole compound include 1H-tetrazole, 5-methyltetrazole, 5-aminotetrazole, and 5-phenyltetrazole.

Examples of the indazole compound include 1H-indazole, 5-amino-1H-indazole, 5-nitro-1H-indazole, 5-hydroxy-1H-indazole, 6-amino-1H-indazole, 6-nitro-1H-indazole, 6-hydroxy-1H-indazole, and 3-carboxy-5-methyl-1H-indazole.

Examples of the indole compound include 1H-indole, 1-methyl-1H-indole, 2-methyl-1H-indole, 3-methyl-1H-indole, 4-methyl-1H-indole, 5-methyl-1H-indole, 6-methyl-1H-indole, 7-methyl-1H-indole, 4-amino-1H-indole, 5-amino-1H-indole, 6-amino-1H-indole, 7-amino-1H-indole, 4-hydroxy-1H-indole, 5-hydroxy-1H-indole, 6-hydroxy-1H-indole, 7-hydroxy-1H-indole, 4-methoxy-1H-indole, 5-methoxy-1H-indole, 6-methoxy-1H-indole, 7-methoxy-1H-indole, 4-chloro-1H-indole, 5-chloro-1H-indole, 6-chloro-1H-indole, 7-chloro-1H-indole, 4-carboxy-1H-indole, 5-carboxy-1H-indole, 6-carboxy-1H-indole, 7-carboxy-1H-indole, 4-nitro-1H-indole, 5-nitro-1H-indole, 6-nitro-1H-indole, 7-nitro-1H-indole, 4-nitrile-1H-indole, 5-nitrile-1H-indole, 6-nitrile-1H-indole, 7-nitrile-1H-indole, 2,5-dimethyl-1H-indole, 1,2-dimethyl-1H-indole, 1,3-dimethyl-1H-indole, 2,3-dimethyl-1H-indole, 5-amino-2,3-dimethyl-1H-indole, 7-ethyl-1H-indole, 5-(aminomethyl)indole, 2-methyl-5-amino-1H-indole, 3-hydroxymethyl-1H-indole, 6-isopropyl-1H-indole, and 5-chloro-2-methyl-1H-indole.

Among them, the heterocyclic compound is preferably a triazole compound, and in particular, 1H-benzotriazole, 5-methyl-1H-benzotriazole, 5,6-dimethyl-1H-benzotriazole, 1-[N,N-bis(hydroxyethyl)aminomethyl]-5-methylbenzotriazole, 1-[N,N-bis(hydroxyethyl)aminomethyl]-4-methylbenzotriazole, 1,2,3-triazole, and 1,2,4-triazole are preferable. These heterocyclic compounds have high chemical or physical adsorption force to the surface of the polishing object. Therefore, a stronger protective film can be formed on the surface of the polishing object. This is advantageous in terms of improving the flatness of the surface of the polishing object after being polished using the polishing composition of the present invention.

In addition, for the surfactant used as a metal corrosion inhibitor, any of an anionic surfactant, a cationic surfactant, an amphoteric surfactant, and a nonionic surfactant may be used.

Examples of the anionic surfactant include polyoxyethylene alkyl ether acetic acid, polyoxyethylene alkyl sulfate ester, alkyl sulfate ester, polyoxyethylene alkyl ether sulfuric acid, alkyl ether sulfuric acid, alkylbenzene sulfonic acid, alkyl phosphate ester, polyoxyethylene alkyl phosphate ester, polyoxyethylene sulfosuccinic acid, alkylsulfosuccinic acid, alkylnaphthalenesulfonic acid, alkyl diphenyl ether disulfonic acid, and salts thereof.

Examples of the cationic surfactant include an alkyltrimethylammonium salt, an alkyldimethylammonium salt, an alkylbenzyldimethylammonium salt, and an alkyl amine salt.

Examples of the amphoteric surfactant include alkylbetaine and alkylamine oxide.

Examples of the nonionic surfactant include polyoxyethylene alkyl ether, polyoxyalkylene alkyl ether, sorbitan fatty acid ester, glycerin fatty acid ester, polyoxyethylene fatty acid ester, polyoxyethylene alkyl amine, and alkyl alkanolamide.

Among these, the surfactant is preferably a polyoxyethylene alkyl ether acetate salt, a polyoxyethylene alkyl ether sulfate salt, an alkyl ether sulfate salt, an alkylbenzene sulfonate salt, and a polyoxyethylene alkyl ether. These surfactants have high chemical or physical adsorption force to the surface of the polishing object. Therefore, a stronger protective film can be formed on the surface of the polishing object. This is advantageous in terms of improving the flatness of the surface of the polishing object after being polished using the polishing composition of the present invention.

The lower limit of the content of the metal corrosion inhibitor in the polishing composition is preferably 0.001 g/L or more, more preferably 0.005 g/L or more, and even more preferably 0.01 g/L or more. In addition, the upper limit of the content of the metal corrosion inhibitor in the polishing composition is preferably 10 g/L or less, more preferably 5 g/L or less, and even more preferably 3 g/L or less. In such a range, the flatness of the surface of the polishing object after being polished using the polishing composition is improved and the polishing rate of the polishing object by the polishing composition is improved.

[Method for Producing Polishing Composition]

The method for producing the polishing composition of the present invention is not particularly limited, and for example, the polishing composition can be obtained by mixing a compound as a cobalt dissolution inhibitor, a pH adjusting agent, and other component as necessary in water through stirring.

The temperature at the time of mixing the respective components is not particularly limited, but is preferably 10 to 40° C., and heating may be performed in order to increase the dissolution rate. In addition, the mixing time is not also particularly limited.

[Polishing Method and Method for Producing Substrate]

As described above, the polishing composition of the present invention can polish a polishing object having a cobalt element-containing layer while suppressing the dissolution of the cobalt element-containing layer. Thus, the polishing composition of the present invention is suitably used in the polishing of the polishing object having a cobalt element-containing layer.

Therefore, the present invention provides a method of polishing a polishing object having a cobalt element-containing layer, wherein a metal wiring layer is polished by the polishing composition of the present invention. In addition, the present invention provides a method for producing a substrate, the method including a step of polishing a polishing object having a cobalt element-containing layer by the polishing method of the present invention.

As a polishing apparatus, it is possible to use a general polishing apparatus which is equipped with a holder to hold a substrate or the like having a polishing object, a motor capable of changing the rotation number, and the like and has a polishing platen capable of being attached with a polishing pad (polishing cloth).

As the polishing pad, it is possible to use a general nonwoven fabric, polyurethane, a porous fluorine resin, and the like without particular limitation. The polishing pad preferably has a grooving so as to save the polishing liquid.

The polishing condition is not also particularly limited, and for example, the rotational speed of the polishing platen is preferably 10 to 500 rpm and the pressure (polishing pressure) applied to the substrate having a polishing object is preferably 0.1 to 10 psi. The method for supplying the polishing composition to the polishing pad is not also particularly limited, and for example, a method of continuously supplying the polishing composition by pump or the like can be employed. There is no limitation on the supply amount, but it is preferable that the surface of the polishing pad be covered with the polishing composition of the present invention at all times.

After the polishing is completed, the substrate is washed with running water and the water droplets attached on the substrate are shaken off and dried by a spin dryer or the like, thereby obtaining a substrate having a cobalt-containing layer.

EXAMPLES

The present invention will be described in more detail using the following Examples and Comparative Examples. However, the technical scope of the present invention is not limited to only the following Examples.

Examples 1 to 15 and Comparative Examples 1 to 10

Preparation of Polishing Composition

Polishing compositions were obtained by mixing (mixing temperature: about 25° C., mixing time: about 10 minutes)

5 g/L of colloidal silica (having an average secondary particle diameter of about 65 nm (average primary particle diameter: 30 nm, association degree: 2) as the abrasive grains, 22 g/L of hydrogen peroxide as the oxidant, 20 g/L of isethionic acid as the polishing accelerating agent, and the cobalt dissolution inhibitors presented in the following Tables 1-1 and 1-2 in water through stirring such that each component had the concentrations described in Tables 1-1 and 1-2, and adjusting the pH to 7.5 by using acetic acid and potassium hydroxide as the pH adjusting agent. The pH of the obtained polishing composition was confirmed at 25° C. with a pH meter. Incidentally, regarding the molecular weight of the cobalt dissolution inhibitor, in the case of a low-molecular compound having a molecular weight of less than 400, the molecular weight was calculated based on the chemical formula, and in the case of a high-molecular compound having a molecular weight of 400 or more, the molecular weight (weight average molecular weight) was measured by GPC (gel permeation chromatography) using polystyrene as a standard substance.

(Evaluation)

1. Measurement of Electrical Quantity

The electrical quantity was evaluated by using potentiostat (Model 1280Z) manufactured by Solartron under the following conditions. At this time, a Co blanket wafer with a film formed thereon by PVD was used as a working electrode, a Pt plate was used as a counter electrode, and an Ag/AgCl electrode was used as a reference electrode. The electrolysis condition at the time of measuring the corrosion potential included a range of an immersion potential ±1.0 V, and the corrosion potential was obtained by a Tafel curve obtained by operating a voltage at a scanning speed of 5 mV/sec. Further, in the measurement of the electrical quantity representing the corrosion amount, a current versus time chart when a voltage of +1.12-0.059×pH was applied to the working electrode was measured based on the potential of the reference electrode, and the electrical quantity was obtained from the integral value of the chart.

Incidentally, in the evaluation of the electrical quantity, unlike the polishing composition described above, compositions obtained by adding 20 g/L of isethionic acid as the polishing accelerating agent and 10 mM of cobalt dissolution inhibitors presented in the following Tables 1-1 and 1-2, and adjusting the pH to 7.5 by using an acetic acid and potassium hydroxide as the pH adjusting agent were used.

2. Evaluation of Solubility of Cobalt (Surface Observation by Visual Inspection and Optical Microscope)

First, a cobalt film was formed on a Si wafer by a PVD method to prepare a blanket Si wafer. At this time, the film thickness was adjusted to 200 nm. The blanket Si wafer was immersed in an evaluation solution (the polishing composition obtained in Example or Comparative Example) for 5 minutes at room temperature (25° C.), and the wafer was subjected to the surface observation by the visual inspection and the optical microscope to perform evaluation. Incidentally, in the observation by the optical microscope, the magnification of the optical microscope was set to five times and then the wafer surface was observed.

The corrosion grade was evaluated based on the following criteria and the results thereof were described in Table 1-1 and Table 1-2.

Evaluation by Visual Evaluation

×: Loss of the Co film by the dissolution of Co or corrosion represented by pits or burning caused by chemical substances was visually observed.

○: Corrosion represented by pits of Co or burning caused by chemical substances was not visually observed.

Evaluation by Optical Microscope

Grade 1: 75% or more of the area in the optical microscopic image was dissolved or corroded;

Grade 2: 10% or more and less than 75% of the area of the optical microscopic image was dissolved or corroded;

Grade 3: 1% or more and less than 10% of the area in the optical microscopic image was dissolved or corroded;

Grade 4: 0.05% or more and less than 1% of the area in the optical microscopic image was dissolved or corroded; and Grade 5: Corrosion was not confirmed in the optical microscopic image observation.

Incidentally, in the above evaluation, Grade 4 or higher is considered to be in a practical range.

3. Measurement of Polishing Rate

The polishing rate was evaluated by performing the polishing under the following conditions.

Polishing Condition

Polishing device: single side CMP polishing device for 200 mm

Pad: polyurethane pad (Shore A61)

Pressure: 2.0 psi (13.8 kPa)

Rotation number of platen: 127 rpm

Rotation number of carrier: 122 rpm

Flow rate of polishing composition: 200 ml/min

Polishing time: 1 minute

The polishing rate was calculated by the following equation.

Polishing rate [nm/min]=quantity of change in film thickness at the time of being polished for 1 minute Film thickness measuring device: sheet resistance measuring device of which the principle was a four-probe DC method The results thereof are presented in Table 1-1 and Table 1-2.

TABLE 1-1

| | Polishing composition | | | | | Evaluation result | | |
| --- | --- | --- | --- | --- | --- | --- | --- | --- |
| | Cobalt dissolution inhibitor | | | | | Corrosion grade | | Cobalt |
| | Compound name | Concentration of cobalt dissolution inhibitor | Structure (functional group) | Molecular weight | pH | Electrical quantity [mC/cm²/min] | Visual evaluation | Evaluation by optical microscope | polishing rate [nm/min] |
| Comparative Example 1 | No addition | 0 g/L (0 mM) | — | — | 7.5 | 35 | × | 1 | 381 |
| Comparative Example 2 | 1H-Benzotriazole | 0.0012 g/L (0.01 mM) | Nitrogen-containing heterocyclic group | 119.12 | 7.5 | 46 | × | 1 | 380 |
| Comparative Example 3 | Acetylacetone | 0.0010 g/L (0.01 mM) | Carbonyl group | 100.12 | 7.5 | 254 | × | 1 | 385 |

TABLE 1-1-continued

| | Polishing composition | | | | | | Evaluation result | | |
| | Cobalt dissolution inhibitor | | | | | | Corrosion grade | | Cobalt |
| | Compound name | Concentration of cobalt dissolution inhibitor | Structure (functional group) | Molecular weight | pH | Electrical quantity [mC/cm$^2$/min] | Visual evaluation | Evaluation by optical microscope | polishing rate [nm/min] |
|---|---|---|---|---|---|---|---|---|---|
| Comparative Example 4 | Naphthenic acid | 0.0013 g/L (0.01 mM) | Carboxyl group | 126.154 | 7.5 | 245 | x | 1 | 388 |
| Example 1 | Oleic acid | 0.0028 g/L (0.01 mM) | Carboxyl group | 282.46 | 7.5 | 9 | ○ | 5 | 288 |
| Comparative Example 5 | Oxalic acid | 0.0009 g/L (0.01 mM) | Carboxyl group | 90.03 | 7.5 | 360 | x | 1 | 384 |
| Example 2 | Abietic acid | 0.0030 g/L (0.01 mM) | Carboxyl group | 302.45 | 7.5 | 21 | ○ | 4 | 331 |
| Example 3 | Lauric acid | 0.0020 g/L (0.01 mM) | Carboxyl group | 200.32 | 7.5 | 2 | ○ | 5 | 295 |
| Comparative Example 6 | Phenethylamine | 0.0012 g/L (0.01 mM) | Amino group | 121.18 | 7.5 | 115 | x | 2 | 363 |
| Comparative Example 7 | Benzoic acid | 0.0012 g/L (0.01 mM) | Carboxyl group | 122.12 | 7.5 | 88 | ○ | 3 | 331 |
| Comparative Example 8 | Phenylphosphonic acid | 0.0016 g/L (0.01 mM) | Phosphonic acid group | 158.09 | 7.5 | 120 | x | 2 | 367 |
| Comparative Example 9 | Phenylsulfonic acid | 0.0018 g/L (0.01 mM) | Sulfonic acid group | 176.18 | 7.5 | 249 | x | 1 | 383 |
| Example 4 | Phenol | 0.0009 g/L (0.01 mM) | Hydroxyl group | 94.11 | 7.5 | 26 | ○ | 4 | 332 |
| Example 5 | Tetrahydrofuran | 0.0007 g/L (0.01 mM) | Ether bond | 72.11 | 7.5 | 20 | ○ | 4 | 330 |
| Example 6 | Furan | 0.0007 g/L (0.01 mM) | Ether bond | 68.07 | 7.5 | 19 | ○ | 4 | 331 |
| Comparative Example 10 | Saccharin | 0.0018 g/L (0.01 mM) | Nitrogen-containing heterocyclic group | 183.18 | 7.5 | 67 | x | 1 | 375 |

TABLE 1-2

| | Polishing composition | | | | | | Evaluation result | | |
| | Cobalt dissolution inhibitor | | | | | | Corrosion grade | | Cobalt |
| | Compound name | Concentration of cobalt dissolution inhibitor | Structure (functional group) | Molecular weight | pH | Electrical quantity [mC/cm$^2$/min] | Visual evaluation | Evaluation by optical microscope | polishing rate [nm/min] |
|---|---|---|---|---|---|---|---|---|---|
| Example 7 | Ammonium lauryl acid (lauryl acid + NH$_3$ aqueous solution) | 0.0022 g/L (0.01 mM) | Carboxyl group (ammonium salt) | 217.35 | 7.5 | 3 | ○ | 5 | 286 |
| Example 8 | Potassium lauryl acid | 0.0024 g/L (0.01 mM) | Carboxyl group (potassium salt) | 238.41 | 7.5 | 2 | ○ | 5 | 288 |
| Example 9 | n-Butanol | 0.00074 g/L (0.01 mM) | Hydroxyl group | 74.12 | 7.5 | 22 | ○ | 4 | 333 |
| Example 10 | n-Propanol | 0.00061 g/L (0.01 mM) | Hydroxyl group | 60.1 | 7.5 | 26 | ○ | 4 | 315 |
| Example 11 | iso-Propyl alcohol | 0.00061 g/L (0.01 mM) | Hydroxyl group | 60.1 | 7.5 | 23 | ○ | 4 | 334 |
| Example 12 | γ-Nonalactone | 0.0016 g/L (0.01 mM) | Ether bond | 156.22 | 7.5 | 28 | ○ | 4 | 338 |
| Example 13 | Polyvinyl alcohol | 0.5 g/L | Hydroxyl group | 10000 | 7.5 | 18 | ○ | 4 | 326 |
| Example 14 | Pullulan | 0.5 g/L | Hydroxyl group and ether bond | 47300 | 7.5 | 21 | ○ | 4 | 331 |
| Example 15 | Polyoxyethylene (20) sorbitan monooleate | 0.6 g/L | Hydroxyl group and ether bond | 428.6 | 7.5 | 14 | ○ | 4 | 324 |

As presented in Table 1-1 and Table 1-2, since the polishing compositions (Examples 1 to 15) of the present invention exhibited a small electrical quantity obtained by electrochemical measurement as compared with the polishing compositions of Comparative Examples, it was shown that the dissolution of the cobalt-containing layer (the barrier layer) was suppressed. In addition, as a result of the corrosion evaluation of the polishing object, which was polished by using each polishing composition of Example and Comparative Example, by the optical microscope observation, it was shown that, in the case of using the polishing composition exhibiting a small electrical quantity (the electrical quantity of less than 35 mC/cm$^2$/min), the dissolution of cobalt was suppressed and the occurrence of pits or corrosion was suppressed. Moreover, it was shown that the dissolution of the cobalt-containing layer was suppressed particularly when the organic compound containing a carboxyl group and a salt thereof were used as a cobalt dissolution inhibitor.

Further, the present application is based on Japanese Patent Application No. 2014-035798, filed on Feb. 26, 2014, the entire contents of which are incorporated herein by reference.

The invention claimed is:
1. A polishing composition used in application in which a polishing object having a cobalt element-containing layer is polished, comprising:
   a cobalt dissolution inhibitor;
   a pH adjusting agent; and
   an abrasive grain, wherein
   the polishing composition has a pH of 7.5 or more and 12 or less, the cobalt dissolution inhibitor is at least one member selected from the group consisting of an organic compound having an ether bond selected from the group consisting of diethyl ether, dipropyl ether, tert-butyl methyl ether, tert-amyl ethyl ether, dimethoxyethane, diethoxyethane, diglyme, triglyme, furan, tetrahydrofuran, tetrahydromethylfuran, dioxolane, a lactone, pullulan, glucomannan, agarose and gelatin; an organic compound having a hydroxyl group selected from the group consisting of methanol, ethanol, n-propanol, iso-propanol, n-butanol, tert-butanol, n-pentanol, n-hexanol, n-octanol, n-nonyl alcohol, n-dodecyl alcohol, n-stearyl alcohol, methoxyethanol, ethoxyethanol, butoxyethanol, and (2-ethoxy)-ethoxyethanol; an aromatic alcohol; an organic compound having a carboxyl group and having a molecular weight of 130 or more; and salts thereof, and the abrasive grain comprises a colloidal silica having an immobilized organic acid.

2. The polishing composition according to claim 1, wherein the organic compound having a hydroxyl group has an alcohol skeleton or a phenol skeleton.

3. The polishing composition according to claim 1, wherein the cobalt dissolution inhibitor is an organic compound having an ether bond and a hydroxyl group.

4. A method of polishing a polishing object having a cobalt element-containing layer, wherein the cobalt element-containing layer is polished by the polishing composition according to claim 1.

5. A method for producing a substrate, comprising,
a step of polishing a polishing object having a cobalt element-containing layer by the polishing method according to claim 4.

6. The polishing composition according to claim 1, wherein the cobalt dissolution inhibitor is at least one member selected from the group consisting of furan, tetrahydrofuran, γ-nonalactone, pullulan, n-propanol, iso-propanol, n-butanol, phenol, lauric acid, oleic acid, abietic acid, potassium lauryl acid, ammonium lauryl acid, and a lauryl acid triethanolamine salt.

7. The polishing composition according to claim 1, wherein the immobilized organic acid is selected from sulfonic acid and carboxylic acid.

8. The polishing composition according to claim 1, wherein the cobalt dissolution inhibitor comprises at least one member selected from the group consisting of a compound represented by $R^1COOH$ and a compound represented by $HOOC-R^2-COOH$; wherein $R^1$ is an alkyl group, alkenyl group, alkynyl group, cycloalkyl group, cycloalkenyl group, or cycloalkynyl group having 7 to 20 carbon atoms, and $R^2$ is an alkylene group, alkenylene group, alkynylene group, cycloalkylene group, cycloalkenylene group, or cycloalkynylene group having 7 to 20 carbon atoms.

9. The polishing composition according to claim 1, wherein the cobalt dissolution inhibitor comprises at least one member selected from a compound represented by $R^1COOH$; wherein $R^1$ is an alkyl group, alkenyl group, alkynyl group, cycloalkyl group, cycloalkenyl group, or cycloalkynyl group having 7 to 20 carbon atoms.

10. The polishing composition according to claim 1, further comprising a polishing accelerating agent, wherein the polishing accelerating agent is selected from the group consisting of methanesulfonic acid, ethanesulfonic acid, and isethionic acid.

* * * * *